US008344039B2

(12) United States Patent
Hanabata

(10) Patent No.: US 8,344,039 B2
(45) Date of Patent: Jan. 1, 2013

(54) THREE-DIMENSIONAL PATTERN FORMING MATERIAL

(75) Inventor: Makoto Hanabata, Funabashi (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 180 days.

(21) Appl. No.: 12/743,681

(22) PCT Filed: Nov. 21, 2008

(86) PCT No.: PCT/JP2008/071242
§ 371 (c)(1),
(2), (4) Date: May 19, 2010

(87) PCT Pub. No.: WO2009/069557
PCT Pub. Date: Jun. 4, 2009

(65) Prior Publication Data
US 2010/0286300 A1    Nov. 11, 2010

(30) Foreign Application Priority Data

Nov. 29, 2007   (JP) ................................ 2007-309256

(51) Int. Cl.
*H01L 21/027*   (2006.01)
*C08F 2/46*     (2006.01)
*C08F 292/00*   (2006.01)
*G03C 9/00*     (2006.01)
(52) U.S. Cl. ........... 522/83; 522/167; 522/172; 430/269
(58) Field of Classification Search .................. 430/269; 522/77, 79, 83, 167, 172; 264/401, 496
See application file for complete search history.

(56) References Cited

U.S. PATENT DOCUMENTS

| 6,183,935 | B1 * | 2/2001  | Hanabata et al. | 430/270.1 |
| 6,399,670 | B1 * | 6/2002  | MacQueen et al. | 522/64 |
| 6,534,235 | B1 * | 3/2003  | Hanabata et al. | 430/191 |
| 6,653,043 | B1 * | 11/2003 | Hanabata | 430/270.1 |
| 6,921,623 | B2 * | 7/2005  | Hanabata et al. | 430/270.1 |

(Continued)

FOREIGN PATENT DOCUMENTS

JP   A-03-149267    6/1991
JP   A-2002-277609  9/2002

(Continued)

OTHER PUBLICATIONS

International Search Report in International Application No. PCT/JP2008/071242; dated Feb. 24, 2009 (with English-language translation).

*Primary Examiner* — Susan W Berman
(74) *Attorney, Agent, or Firm* — Oliff & Berridge, PLC

(57) ABSTRACT

There is provided a photo-curable composition that shows the suppression of a residual film formation and a high adhesion thereof to a substrate in a process for forming a three-dimensional pattern by a photo-imprinting method. A photo-curable composition for forming a three-dimensional pattern by a photo-imprinting method, comprises a monomer having a photopolymerizable group; an inorganic fine particle to which a dispersant is added; and a photopolymerization initiator. It is preferred that the inorganic fine particle (e.g., silica) has an average particle diameter of 1 to 1,000 nm, and the dispersant is a silane coupling agent, particularly a silane coupling agent containing an organic group having a carbon-carbon unsaturated bond or an organic group having an epoxy group.

5 Claims, 2 Drawing Sheets

U.S. PATENT DOCUMENTS

| | | | |
|---|---|---|---|
| 7,935,472 B2 * | 5/2011 | Ogino et al. | 430/270.1 |
| 2010/0097715 A1 * | 4/2010 | Sakata et al. | 360/55 |

FOREIGN PATENT DOCUMENTS

| | | |
|---|---|---|
| JP | A-2003-098333 | 4/2003 |
| JP | A-2003-098334 | 4/2003 |
| JP | A-2003-330180 | 11/2003 |
| JP | A-2004-304097 | 10/2004 |
| JP | A-2005-070434 | 3/2005 |
| JP | A-2005-354017 | 12/2005 |
| JP | A-2006-039106 | 2/2006 |
| JP | A-2007-177194 | 7/2007 |
| JP | A-2007-216501 | 8/2007 |
| JP | A-2007-250253 | 9/2007 |

* cited by examiner

THREE-DIMENSIONAL PATTERN FORMING MATERIAL

TECHNICAL FIELD

The present invention relates to a photo-curable composition for forming a three-dimensional pattern by a photo-imprinting method.

BACKGROUND ART

In recent years, there has been developed a technology for transferring a pattern that is called an imprinting method. The imprinting technology is also called a nano-imprinting technology and is a mold processing technology by pressing a nano-stamper (mold) in which a concavo-convex pattern of nano scale is formed to a substrate coated with a resin thin film to transfer the concavo-convex pattern to the resin thin film. The imprinting technology can perform a nano-scale processing more simply and with lower cost than photolithography or electron beam lithography in semiconductor lithography of the related-art perform.

The imprinting method is classified broadly into a thermal imprinting method and a photo-imprinting method. Among them, the thermal imprinting method is a production method of a three-dimensional molded form including: applying a thermo-curable composition on a substrate; heating the thermo-curable composition to a heat distortion temperature of the thermo-curable composition or higher while pressure-bonding a mold having a three-dimensional concavo-convex shape on the surface thereof to the thermo-curable composition to thermally cure the composition; and removing the mold to transfer a three-dimensional shape of the mold to the cured resin. The thermal imprinting method is used synonymously with an emboss method, a press method, a replica method, a transfer copying method or the like.

On the other hand, the photo-imprinting method is attracting attention as a technology capable of producing a three-dimensional molded form with high precision and low cost particularly in applications such as semiconductor lithography, fine optical parts, photonic crystals, members for a flat panel display, micro chemical chips and the like. The photo-imprinting method is a production method of a three-dimensional molded form including: using as a mold, a transparent material such as quartz; coating a substrate with a photo-curable resin; irradiating the photo-curable composition with an ultraviolet ray while pressure-bonding a mold having a three-dimensional concavo-convex shape on the surface thereof to the thermo-curable composition to photo-cure the composition; and removing the mold to transfer a three-dimensional shape of the mold to the cured resin.

As the photo-curable composition, there is a well-known non-solvent type photo-curable composition containing an acrylic resin and a photo-radical polymerizing agent (see Non-patent Document 1).

However, when the above photo-curable composition is used, there is the problem that when the molded form is released from the mold after a compression molding, the composition remains as a residual film in a part which is pressed by a convex portion, so that a desired three-dimensional molded article is difficult to be obtained. In the related-art, for removing a residual film formed in various pattern transferring technologies, the following methods have been developed:

(i) removing the composition using a reactive ion etching or the like after the mold release (see Non-patent Document 2 and Patent Document 1);

(ii) high-pressure jetting a developer containing a surfactant to the residual film after the mold release, and subjecting the residual film to an ashing treatment (see Patent Document 2) or a process for brushing the residual film (see Patent Document 3);

(iii) providing a photo-curing reaction-controlling film capable of blocking a photo-curing reaction on a mold having a concavo-convex shape (see Patent Document 4); and (iv) providing a light shielding film in a convex portion of a mold having a concavo-convex shape (Patent Document 5). However, in the methods of (i) and (ii), the number of transferring processes increases, which leads to the elevation of the process cost. In addition, in the methods of (iii) and (iv), the mold production process becomes complex, which leads to the elevation of the mold cost.

On the other hand, for fundamentally suppressing the formation of the residual film during the transfer of the three-dimensional pattern, it is preferred that the fluidity of the composition is enhanced by minimizing the viscosity of the photo-curable composition, whereby the photo-curable composition is easily squeezed out by a mold convex portion during the pressurization. However, by lowering the viscosity of the photo-curable composition, the shape maintainability of a coating film formed after applying the photo-curable composition on a substrate lowers, which easily causes a film rupture, so that it is necessary to enhance the adhesion of the coating film to the substrate.

In the related-art, for enhancing the adhesion of a coating film formed on a substrate, there are known methods such as:

(a) forming a fine concavo-convex shape on the surface of the substrate (see Patent Document 6), (b) as a binder of a coating film-forming material, using a binder having a functional group capable of forming a hydrogen bond between the coating film and its underlayer (see Patent Document 7), (c) enhancing wettability of a coating film-forming material on the surface of the substrate with an alcoholic alkali liquid to suppress the coating film rupture (Non-patent Document 3), and (d) blending inorganic fine particles in a curable composition (see Patent Document 8).

However, in the method (a), there is a problem that a fine concavo-convex shape formed on the substrate surface is transferred to the molded form to lower the performance of the molded form in an application in which the molded form is utilized. In addition, in the case of using the method (b), there is a problem that the degree of freedom of the material design of the photo-curable composition with respect to the formation of the three-dimensional pattern is hindered. Further, although the method (c) can be mentioned as the most general as a method for enhancing the adhesion of the coating film to the substrate, the method (c) leads to an adverse effect in the imprinting technology application that is an object of the present invention, particularly in terms of suppression of the formation of a residual film at a mold convex portion. Then, by the method (d), it is difficult to homogeneously disperse inorganic fine particles in the curable composition, so that the inorganic fine particles agglomerate or precipitate and the fluidity of the composition lowers. Further, when such a curable composition in which inorganic fine particles are heterogeneously dispersed is spin-coated, there is caused the problem that foreign matters are observed in the coating film and the film thickness becomes heterogeneous, so that an advantageous coating film cannot be obtained and a desired three-dimensional processed form is difficult to be obtained.

Non-patent Document 1: "PAK-01" products catalogue made by Toyo Gosei Co., Ltd.
Non-patent Document 2; Hiroshima, Optical and Electro-Optical Engineering Contact, vol. 43, p. 624 (2005)
Non-patent Document 3: "Zoku jikken wo anzenni okonautameni (For safely performing the experiment, sequel)", p. 4 (1987), published by Kagaku-dojin Publishing Company, INC.
Patent Document 1: Japanese Patent Application Publication No. JP-A-2006-39106
Patent Document 2: Japanese Patent Application Publication No. JP-A-2003-98334
Patent Document 3: Japanese Patent Application Publication No. JP-A-2003-98333
Patent Document 4: Japanese Patent Application Publication No. JP-A-2005-354017
Patent Document 5; Japanese Patent Application Publication No. SP-A-2004-304097
Patent Document 6: Japanese Patent Application Publication No. JP-A-2005-70434
Patent Document 7: Japanese Patent Application Publication No. JP-A-2002-277609
Patent Document 8: Japanese Patent Application Publication No. JP-A-2007-177194

DISCLOSURE OF THE INVENTION

Problems to be Solved by the Invention

In order to solve the problems described above, it is an object of the present invention to provide a photo-curable composition that shows the suppression of a residual film formation and a high adhesion thereof to a substrate in a process for forming a three-dimensional pattern by a photo-imprinting method.

Means for Solving the Problems

As a result of assiduous research intended to overcome these disadvantages, the inventor of the present invention has found that by using a specific photo-curable composition, the formation of a residual film can be suppressed and a high adhesion of the composition to a substrate can be obtained, and has completed the present invention.

The present invention is, according to a first aspect, a photo-curable composition for forming a three-dimensional pattern by a photo-imprinting method, characterized by containing a monomer having a photopolymerizable group, an inorganic fine particle to which a dispersant is added and a photopolymerization initiator;

according to a second aspect, the photo-curable composition according to the first aspect, in which the inorganic fine particle has an average particle diameter of 1 to 1,000 nm;

according to a third aspect, the photo-curable composition according to the first aspect or the second aspect, in which the inorganic fine particle is silica;

according to a fourth aspect, the photo-curable composition according to any one of the first aspect to the third aspect, in which the dispersant is a silane coupling agent;

according to a fifth aspect, the photo-curable composition according to the fourth aspect, in which the dispersant is a silane coupling agent containing an organic group having a carbon-carbon unsaturated bond or an organic group having an epoxy group;

according to a sixth aspect, the photo-curable composition according to any one of the first aspect to the third aspect, in which the dispersant is a methacryloxypropyl trialkoxysilane or a glycidoxypropyl trialkoxysilane;

according to a seventh aspect, the photo-curable composition according to any one of the first aspect to the sixth aspect, in which the photopolymerizable group of the monomer is at least one organic group selected from a group consisting of an acryl group, a methacryl group, a vinyl group, an epoxy group, an oxetane group and a vinyl ether group;

according to an eighth aspect, the photo-curable composition according to the seventh aspect, in which the photopolymerizable group of the monomer is an acryl group or a methacryl group;

according to a ninth aspect, the photo-curable composition according to any one of the first aspect to the eighth aspect, in which the monomer contains a monofunctional monomer, a difunctional monomer and a trifunctional monomer in a mass ratio of monofunctional monomer:difunctional monomer:trifunctional monomer=1:0.2 to 2.0:0.2 to 2.0; and according to a tenth aspect, the photo-curable composition according to the ninth aspect, in which the monofunctional monomer is a cyclic amine-containing acrylate monomer.

Effects of the Invention

According to the present invention, in a process for forming a three-dimensional pattern by a photo-imprinting method, by imparting a preferred viscosity (fluidity) to a photo-curable composition, it is possible to provide a photo-curable composition that can suppress the formation of a residual film as well as form a coating film of the photo-curable composition on a substrate without causing a coating film rupture in spite of a low viscosity of the composition.

In the photo-curable composition of the present invention, by dispersing inorganic fine particles to which a dispersant is added in a monomer, fluidity for forming a three-dimensional pattern is imparted to the composition. Therefore, the formation of a residual film is suppressed, and the peeling of the composition from the mold becomes easy, thereby enhancing the adhesion of the composition to the substrate. Further, because a dispersant is added to the inorganic fine particles, the dispersibility of the inorganic fine particles in the monomer is largely enhanced and the fluidity of the composition and the homogeneity during a spin-coating of the composition are enhanced, which is advantageous for the suppression of the residual film formation and the enhancement of the adhesion to the substrate.

BEST MODES FOR CARRYING OUT THE INVENTION

Preferred embodiments of the present invention are described, however, these embodiments should not be construed as limiting the scope of the present invention.

The photo-curable composition of the present invention contains a monomer having a photopolymerizable group, inorganic fine particles to which a dispersant for imparting dispersibility in the monomer to the inorganic fine particles is added, and a photopolymerization initiator.

The photo-curable composition of the present invention contains a monomer having a photopolymerizable group, inorganic tine particles to which a dispersant is added, and a photopolymerization initiator in a content of 15 to 95% by mass, 4 to 60% by mass, and 0.08 to 5% by mass, respectively. The amount of the dispersant may be an amount capable of covering the surface of the inorganic fine particle and for example, the dispersant can be added to the inorganic fine particles in an amount of 1 to 10,000 parts by mass, preferably 10 to 300 parts by mass, further preferably 50 to 200 parts by mass, relative to 100 parts by mass of the inorganic fine particles.

Examples of the monomer having a photopolymerizable group used in the present invention include monofunctional monomers, polyfunctional monomers and combinations thereof. The monofunctional monomer and the polyfunctional monomer are defined according to the number of photopolymerizable groups in one molecule of the monomer.

Examples of the polyfunctional monomer include difunctional monomers, trifunctional monomers and monomers having more than 3 functional groups, and among them, the difunctional monomer and the trifunctional monomer are preferred.

In addition, the above monomers include oligomers.

Examples of the photopolymerizable group include an acryl group, a methacryl group, a vinyl group, an epoxy group, an oxetane group and a vinyl ether group.

Specific examples of the monomer having a photopolymerizable group include monomers having an acryl group or a methacryl group, for example alkyl (meth)acrylates such as (meth)acrylic acid, methyl(meth)acrylate, butyl(meth)acrylate, 2-ethylhexyl(meth)acrylate and lauryl(meth)acrylate; cyclohexyl(meth)acrylate; benzyl(meth)acrylate; dimethylaminoethyl(meth)acrylate; carbitol(meth)acrylate; 2-hydroxyethyl(meth)acrylate; 2-hydroxypropyl(meth)acrylate; glycidyl(meth)acrylate; (meth)acrylamide; N-methylol (meth)acrylamide; N-diacetone(meth)acrylamide; N,N'-methylene bis(meth)acrylamide; (meth)acrylonitrile; ethylene glycol di(meth)acrylate; diethylene glycol di(meth)acrylate; triethylene glycol di(meth)acrylate; polyethylene glycol di(meth)acrylate; polypropylene glycol di(meth)acrylate; 1,4-butanediol di(meth)acrylate; neopentyl glycol di(meth) acrylate; 1,6-hexanediol di(meth)acrylate; pentaerythritol di(meth)acrylate; pentaerythritol tri(meth)acrylate; trimethylolpropane tri(meth)acrylate; and pentaerythritol tetra(meth) acrylate. Specific examples further include tetramethylolmethane tetra(meth)acrylate, (meth)acrylic acid ester of 2,2, 5,5-tetrahydroxymethylcyclopentanone, (meth)acrylic acid ester of diglycidyl phthalate, (meth)acrylic acid ester of N,N, N',N'-tetrakis(β-hydroxyethyl)ethylenediamine, products of a transesterification reaction between triglycerin and methyl acrylate, and urethane-type (meth)acrylate.

Examples of the monomer having a vinyl group include vinyl alcohol, styrene, hydroxy styrene and divinyl benzene.

Examples of the monomer having an epoxy group include 1,4-butanediol diglycidyl ether, 1,2-epoxy-4-(epoxyethyl) cyclohexane, glycerol triglycidyl ether, diethylene glycol diglycidyl ether, 2,6-diglycidyl phenyl glycidyl ether, 1,1,3-tris[p-(2,3-epoxypropoxy)phenyl]propane, 1,2-cyclohexane dicarboxylic acid diglycidyl ester, 4,4'-methylene bis(N,N-diglycidylaniline), 3,4-epoxycyclohexylmethyl-3,4-epoxycyclohexane carboxylate, trimethylol ethane triglycidyl ether, triglycidyl-p-aminophenol, tetraglycidylmetaxylenediamine, tetraglycidyldiaminodiphenylmethane, tetraglycidyl-1,3-bisaminomethylcyclohexane, bisphenol-A-diglycidyl ether, bisphenol-S-diglycidyl ether, pentaerythritol tetraglycidyl ether resorcinol diglycidyl ether, diglycidyl phthalate ester, neopentyl glycol diglycidyl ether, polypropylene glycol diglycidyl ether, tetrabromo bisphenol-A-diglycidyl ether, bisphenol hexafluoroacetone diglycidyl ether, pentaerythritol diglycidyl ether, tris-(2,3-epoxypropyl)isocyanurate, monoallyldiglycidyl isocyanurate, diglycerol polydiglycidyl ether, pentaerythritol polyglycidyl ether, 1,4-bis(2,3-epoxypropoxyperfluoroisopropyl)cyclohexane, sorbitol polyglycidyl ether, trimethylolpropane polyglycidyl ether, resorcin diglycidyl ether, 1,6-hexanediol diglycidyl ether, polyethylene glycol diglycidyl ether, phenyl glycidyl ether, p-tert-butylphenyl glycidyl ether, adipic acid diglycidyl ether, o-phthalic acid diglycidyl ether, dibromophenyl glycidyl ether, 1,2,7,8-diepoxyoctane, 1,6-dimethylolperfluorohexane diglycidyl ether, 4,4'-bis(2,3-epoxypropoxyperfluoroisopropyl)diphenyl ether, 2,2-bis(4-glycidyloxyphenyl) propane, 3,4-epoxycyclohexylmethyl-3',4'-epoxycyclohexanecarboxylate, 3,4-epoxycyclohexyloxirane, 2-(3,4-epoxycyclohexyl)-3',4'-epoxy-1,3-dioxane-5-spirocyclohexane, 1,2-ethylenedioxy-bis(3,4-epoxycyclohexylmethane), 4',5'-epoxy-2'-methylcyclohexylmethyl-4,5-epoxy-2-methylcyclohexanecarboxylate, ethylene glycol-bis(3,4-epoxycyclohexanecarboxylate), bis(3,4-epoxycyclohexylmethyl)adipate, and bis(2,3-epoxycyclopentyl)ether, bisphenol-A-diglycidyl ether, triglycidyl isocyanurate, monoallyldiglycidyl isocyanurate.

Examples of the monomer having an oxetane group include 3-ethyl-3-hydroxymethyloxetane, 3-ethyl-3-(phenoxymethyl)oxetane, 3,3-diethyloxetane, and 3-ethyl-3-(2-ethylhexyloxymethyl)oxetane, 1,4-bis(((3-ethyl-3-oxetanyl) methoxy)methyl)benzene, di((3-ethyl-3-oxetanyl)methyl) ether, and pentaerythritol tetrakis((3-ethyl-3-oxetanyl) methyl)ether.

Examples of the monomer having a vinyl ether group include vinyl-2-chloroethyl ether, vinyl-n-butyl ether, 1,4-cyclohexanedimethanol divinyl ether, vinyl glycidyl ether, bis(4-(vinyloxymethyl)cyclohexylmethyl)glutarate, tri(ethylene glycol)divinyl ether, divinyl adipate ester, diethylene glycol divinyl ether, tris(4-vinyloxy)butyltrimellitate, bis(4-(vinyloxy)butyl)terephthalate, bis(4-(vinyloxy)butyl)isophthalate, ethylene glycol divinyl ether, 1,4-butanediol divinyl ether, tetramethylene glycol divinyl ether, tetraethylene glycol divinyl ether, neopentyl glycol divinyl ether, trimethylolpropane trivinyl ether, trimethylolethane trivinyl ether, hexanediol divinyl ether, 1,4-cyclohexanediol divinyl ether, tetraethylene glycol divinyl ether, pentaerythritol divinyl ether, pentaerythritol trivinyl ether and cyclohexanedimethanol divinyl ether.

The monomers having a photopolymerizable group may be used individually or in combination of two or more types thereof. Among these monomers having a photopolymerizable group, preferred are monomers having an acryl group or a methacryl group as a photopolymerizable group. These monomers can be selected from at least one type of monomer selected from a group consisting of monofunctional monomers, difunctional monomers and trifunctional monomers. Further, these monomers are preferably a combination of a monofunctional monomer, a difunctional monomer and a trifunctional monomer. The monomer may be used in a mass ratio of monofunctional monomer:difunctional monomer:trifunctional monomer=1:0.2 to 2.0:0.2 to 2.0.

Preferred examples of the monofunctional monomer include alkyl (meth)acrylates such as (meth)acrylic acid, methyl(meth)acrylate, butyl(meth)acrylate, 2-ethylhexyl (meth)acrylate and lauryl(meth)acrylate; cyclohexyl(meth) acrylate; benzyl(meth)acrylate; dimethylaminoethyl(meth) acrylate; carbitol(meth)acrylate; 2-hydroxyethyl(meth) acrylate; 2-hydroxypropyl(meth)acrylate; and glycidyl (meth)acrylate. Examples of the cyclic amine-containing monofunctional acrylate monomer include acryloyl morpholine and methacryloyl morpholine. By using the cyclic amine-containing monofunctional acrylate monomer, the reaction between silica particles and the silane coupling agent to be reacted with the surface of the silica particles becomes more solid.

Preferred examples of the difunctional monomer include ethylene glycol di(meth)acrylate, diethylene glycol di(meth)acrylate, triethylene glycol di(meth)acrylate, polyethylene glycol di(meth)acrylate, polypropylene glycol di(meth)acrylate, 1,4-butanediol di(meth)acrylate, neopentyl glycol di(meth)acrylate, 1,6-hexanediol di(meth)acrylate and pentaerythritol di(meth)acrylate.

Preferred examples of the trifunctional monomer include pentaerythritol tri(meth)acrylate, trimethylolpropane tri(meth)acrylate and pentaerythritol tetra(meth)acrylate.

By blending the monofunctional monomer, the difunctional monomer and the trifunctional monomer in a mass ratio in the above range, the rigidity of the cured form can be controlled. By blending only the monofunctional monomer, the cured form is rigid, and on the other hand, by blending only the trifunctional monomer, the cured form is brittle.

The inorganic fine particle used in the present invention has preferably an average particle diameter of 1 to 1,000 nm. Due to the relationship with transparency, the average particle diameter is preferably in a range of 3 to 100 nm, particularly preferably in a range of 5 to 20 nm. The measurement of the average particle diameter is performed by a method of observing the particle under an electron microscope or by a method of measuring a particle diameter of particles that are dispersed in a sol by a dynamic light scattering method in a liquid.

The type of the inorganic fine particle is not particularly limited so long as the inorganic fine particle is en inorganic fine particle having a functional group capable of reacting with a dispersant described later or an inorganic fine particle in which the functional group is introduced. Specific examples of such an inorganic fine particle include metals (elemental substance), inorganic oxides, inorganic carbonates, inorganic sulfates and phosphates. Examples of the metal (elemental substance) include alkaline earth metals, transition metals and rare earth metals. Examples of the inorganic oxide include silica, alumina, titania, zirconia, zinc oxide, barium titanate, lithium niobate, tin oxide and indium oxide. Examples of the inorganic carbonate include calcium carbonate and magnesium carbonate. Examples of the inorganic sulfate include barium sulfate and calcium sulfate. Examples of the phosphate include calcium phosphate and magnesium phosphate. Among them, silica excellent in transparency is preferably used.

The shape of the inorganic fine particle is not particularly limited and may be a spherical shape, an elliptical shape, a flat shape, a rod shape or a fiber shape. The inorganic fine particle has an average particle diameter of, preferably 1 to 1,000 nm, more preferably 3 to 100 nm, most preferably 5 to 20 nm. Due to the average particle diameter of the inorganic fine particle within the above range, the dispersibility of the inorganic fine particle in the monomer having a photopolymerizable group can be enhanced and the transparency of the material for forming a three-dimensional pattern of the present invention can be further enhanced.

The inorganic fine particle to which a dispersant is added is preferably dispersed in a solvent. Preferred examples of the inorganic fine particle dispersed in a solvent include colloidal silica. Colloidal silica dispersed in an organic solvent is commercially available as organosilicasol and examples thereof include "SNOWTEX colloidal silica" (trade name; manufactured by Nissan Chemical Industries, Ltd.). Examples of the organic solvent include methanol, ethanol, isopropanol, butanol, propylcellosolve, dimethylacetoamide, toluene, xylene, ethyl acetate, propylene glycol monomethyl ether, propylene glycol monomethyl ether acetate, methyl ethyl ketone and methyl isobutyl ketone.

To the inorganic fine particle used in the present invention, a dispersant is necessary to be added for imparting the dispersibility in the monomer having a photopolymerizable group to the inorganic fine particle. Examples of the dispersant used for this purpose include a silane coupling agent. Examples of the silane coupling agent include silane coupling agents having a functional group with an unsaturated bond or the like such as an isocyanate group, an epoxy group, an amino group, a mercapto group, a hydroxyl group, a carboxyl group and a (meth)acryloyl group.

Examples of the isocyanate group-containing silane coupling agent include isocyanatoalkylalkoxysilanes (for example, an isocyanato $C_{1-6}$ alkyl $C_{1-4}$ alkoxysilane) such as 1-isocyanatomethyl-1,1,1-trimethoxysilane, 1-(1- or 2-isocyanatoethyl)-1,1,1-trimethoxysilane, 1-isocyanatomethyl-1,1,1-triethoxysilane, 1-(1- or 2-isocyanatoethyl)-1,1,1-triethoxysilane, 1-isocyanatomethyl-1-methyl-1,1-dimethoxysilane, 1-chloro-1-isocyanatomethyl-1,1-dimethoxysilane, 1-(3-aminopropyl)-1-isocyanatoethyl-1,1-dimethoxysilane, 1-(3-aminopropyl)-1-isocyanatoethyl-1,1-diethoxysilane, 1-isocyanatomethyl-1-phenyl-1,1-dimethoxysilane, and 1-isocyanatopropyl-1-phenyl-1,1-dipropoxysilane.

Example of the epoxy group-containing slime coupling agent include epoxyalkylalkoxysilanes (for example, an epoxy group-containing $C_{3-8}$ alkyl-$C_{1-4}$ alkoxysilane) such as glycidoxypropyltrimethoxysilane, glycidoxypropyltriethoxysilane, 1-(1,2-epoxypropyl)-1,1,1-trimethoxysilane and 1-glycidyl-1,1,1-trimethoxysilane; and glycidoxyalkylalkoxysilanes (for example, a glycidoxy $C_{1-6}$ alkyl $C_{1-4}$ alkoxysilane) such as 1-(3-glycidoxypropyl)-1,1,1-trimethoxysilane and 1-(3-glycidoxypropyl)-1-methyl-1,1-dimethoxysilane.

Examples of the amino group-containing silane coupling agent include amino group-containing silane coupling agents corresponding to the above isocyanate group-containing silane coupling agents, particularly an aminoalkylalkoxysilane (for example, an amino $C_{1-6}$ alkyl-$C_{1-4}$ alkoxysilane) such as 1-(3-N-(2'-aminoethyl)aminopropyl)-1-methyl-1,1-dimethoxysilane, 1-(3-N-(2'-aminoethyl)aminopropyl)-1,1,1-trimethoxysilane and 1-(3-aminopropyl)-1,1,1-trimethoxysilane.

Examples of the mercapto group-containing silane coupling agent include mercapto group-containing silane coupling agents corresponding to the above isocyanate group-containing silane coupling agents, particularly alkoxysilanes having a mercaptoalkyl group (for example, a mercapto $C_{1-6}$ alkyl $C_{1-4}$ alkoxysilane) such as 1-(3-mercaptopropyl)-1,1,1-trimethoxysilane and 1-(3-mercaptopropyl)-1,1,1-triethoxysilane.

In addition, hydroxyl group-containing silane coupling agents and carboxyl group-containing slime coupling agents each corresponding to the above isocyanate group-containing silane coupling agents can be also used.

Examples of the slime coupling agent having an unsaturated bond include silane coupling agents having a polymerizable group such as a vinyl group, an allyl group and a (meth)acryloyl group. Examples of the vinyl group-containing coupling agent include 1-vinyl-1,1-dimethyl-1-ethoxysilane, 1-vinyl-1,1,1-trimethoxysilane, 1-vinyl-1,1,1-triisopropenoxysilane, 1-vinyl-1,1-dimethyl-1-chlorosilane, 1-vinyl-1-methyl-1,1-dichlorosilane, 1-vinyl-1-ethyl-1,1-dichlorosilane, 1-vinyl-1,1,1-trichlorosilane, 1-vinyl-1-methyl-1,1-bis(methylethylketoximine)silane, 1-vinyl-1-methyl-1-bis(trimethylsiloxy)silane, 1-vinyl-1-methyl-1,1-diacetoxysilane, 1-vinyl-1,1,1-triphenoxysilane and 1-vinyl-1,1,1-tris(tert-butylperoxy)silane. In addition, allyl group-containing silane coupling agents and (meth)acryloyl group- (or (meth)acryloyloxy group-) containing silane coupling agents each corresponding to the above vinyl group-containing silane coupling agents can be also used. Examples of these silane coupling agents include methacryloxypropyltrimethoxysilane, acryloxypropyltrimethoxysilane, methacryloxypropyltriethoxysilane and acryloxypropyltriethoxysilane.

Among these silane coupling agents, preferred are silane coupling agents containing an organic group having a carbon-carbon unsaturated bond or an organic group having an epoxy group.

Examples of such a silane coupling agent include methacryloxypropyl trialkoxysilanes and glycidoxypropyl trialkoxysilanes. Examples of the alkoxy group in these slime coupling agents include a methoxy group, an ethoxy group, a propoxy group and an isopropoxy group.

Methacryloxypropyl trimethoxysilane is a silane of Formula (1):

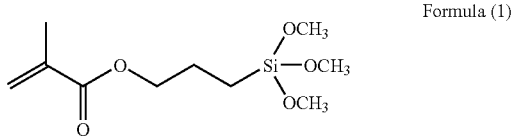 [SMILES: C=C(C)C(=O)OCCC[Si](OC)(OC)OC]

Formula (1)

and glycidoxypropyl trimethoxysilane is a silane of Formula (2):

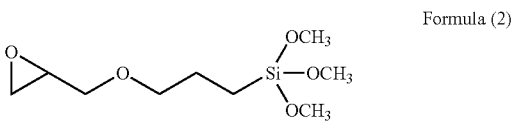 [SMILES: CO[Si](CCCOCC1CO1)(OC)OC]

Formula (2)

These silanes can be preferably used.

Methacryloxypropyl trimethoxysilane is commercially available, for example from Chisso Corporation under a trade name of "Sila-Ace S710", and besides this commercial product, various silane coupling agents are commercially available. These silane coupling agents can be used in the present invention.

Examples of the method for adding a dispersant (silane coupling agent) to the inorganic fine particle include a method of stirring inorganic fine particles and a silane coupling agent in an appropriate solvent at room temperature in the presence of water and a catalyst. The stirring may be performed for several minutes to 24 hours. Preferably, during the reaction, an inorganic acid such as hydrochloric acid, nitric acid and sulfuric acid or an organic acid such as formic acid, oxalic acid, acetic acid and maleic acid can be added as an acid catalyst. The acid catalyst can be used as an aqueous solution thereof. By this method, there can be obtained coated fine particles in which a silane coupling agent is added to the surface of the inorganic fine particles through a chemical bond.

One example of this method is a method including: adding an aqueous solution of a silane coupling agent and an acid catalyst to an aqueous sol of inorganic fine particles (for example, the concentration of the inorganic fine particles is 5 to 40% by mass) to hydrolyze the inorganic fine particles; and exchanging the solvent of the aqueous sol of the inorganic fine particles coated with the silane coupling agent with an organic solvent, to convert the aqueous sol into an organosol.

In addition, other examples thereof are: a method of adding an aqueous solution of hydrochloric acid, acetic acid, maleic acid or the like to an organosol in which inorganic fine particles are dispersed in a hydrophilic organic solvent such as methanol and ethanol (for example, the concentration of the inorganic fine particles is 5 to 40% by mass) to hydrolyze the inorganic fine particles and to produce an organosol in which inorganic fine particles coated with a silane coupling agent are dispersed in an organic solvent; and a method of using an organosol in which the organic solvent of the above organosol is exchanged with another organic solvent, for example a high boiling point organic solvent. These organosols of inorganic fine particles to which a dispersant is added can be used as an organosol in which the concentration of the inorganic fine particles in an organic solvent is in a range of 5 to 40% by mass.

The obtained organosol can be blended with a photopolymerizable monomer and a photopolymerization initiator to prepare a photopolymerizable composition.

Examples of the photopolymerization initiator include ketones (such as acetophenone, propiophenone, anthraquinone, thioxanthone, benzophenone and derivatives thereof), benzoin ether or derivatives thereof, benzylketal derivatives, α-hydroxyacetophenones, α-aminoacetophenones, acylphosphine oxides, o-acyloximes, triallylsulfonium salts, diallyliodonium salts, dialkylphenacylsulfonium salts, dialkyl-4-hydroxyphenylsulfonium salts, sulfonic acid esters, o-acyloximes, o-carbamoyloxime compounds and ammonium salt compounds.

The photo-curable composition of the present invention may contain other components. Examples of the other component include sensitizers and surfactants.

In the photo-curable composition for forming a three-dimensional pattern of the present invention, the inorganic fine particles to which a dispersant is added are blended in an amount of preferably 5 to 400 parts by mass, more preferably 5 to 200 parts by mass, further preferably 5 to 100 parts by mass, most preferably 30 to 100 parts by mass, relative to 100 parts by mass of the monomer having a photopolymerizable group. To blend the inorganic fine particles within this range is preferred for reducing the residual film and enhancing the adhesion of the composition, which are the objects of the present invention. As other advantages, the degree of curing shrinkage and the heat resistance of the composition during the photo-imprinting are enhanced.

The blending amount of the photopolymerization initiator is preferably 0.1 to 20 parts by mass, further preferably 1 to 10 part(s) by mass, most preferably 1 to 5 part(s) by mass, relative to 100 parts by mass of the monomer.

The photo-curable composition of the present invention for forming a three-dimensional pattern can be obtained by homogeneously blending the monomer having a photopolymerizable group, the inorganic fine particles to which a dispersant is added and the photopolymerization initiator.

Here, when the inorganic fine particles to which a dispersant is added are in a condition where the inorganic fine particles are dispersed in a solvent, the photo-curable composition can be produced by a method including: adding an organosol in which the inorganic fine particles to which a dispersant is added are dispersed to the monomer having a photopolymerizable group to homogeneously mix the resultant mixture; removing the solvent under reduced pressure using an evaporator or the like; and adding a photopolymerization initiator to the resultant residue.

Next, there is described a method of using the photo-curable composition of the present invention for forming a three-dimensional pattern.

In the present invention, the using method includes: a process for forming the photo-curable composition of the present invention for forming a three-dimensional pattern on a substrate; a process for pressure-bonding the photo-curable composition so that a part of the photo-curable composition thoroughly enters into a concave portion of a translucent mold having a concavo-convex shape on the surface thereof; a process for irradiating the rear surface of the mold (the other surface of the mold opposite to the surface on which the mold is contacted with the photo-curable composition) with light; and a process for peeling the mold from the composition cured by the irradiation with light. Examples of the method for forming the photo-curable composition of the present invention for forming a three-dimensional pattern on the substrate include a spin-coating method, a die-coating method, a roll-coating method and a dipping method. Among these methods, the spin-coating method is commonly used. As the light with which the composition is irradiated, an ultraviolet ray is commonly used. However, a light other than the ultraviolet ray may be used so long as the photo-curable composition for forming a three-dimensional pattern can be cured with the light.

Examples of the ultraviolet ray irradiation apparatus include an ultra-high pressure mercury lamp, a high pressure mercury lamp, a low pressure mercury lamp, a xenon lamp, a metal halide lamp, an excimer lamp and a light-emitting diode. The exposure wavelength is, for example 150 to 1,000 nm and examples thereof include F2 excimer laser (wavelength: 157 nm), ArF excimer laser (wavelength: 193 nm), KrF excimer laser (wavelength: 248 nm), Hg lamp i-line (wavelength: 365 nm), Hg lamp g-line (wavelength: 436 nm), Hg lamp h-line (wavelength: 405 nm) and NeHe laser (wavelength: 632 nm).

EXAMPLES

Hereinafter, the present invention will be farther described in more detail retching to Examples which should not be construed as limiting the scope of the present invention.

Example 1

(Preparation of Inorganic Fine Particle to which Dispersant is Added)

1,500 parts by mass of an organosilicasol (trade name: IPA-ST; manufactured by Nissan Chemical Industries, Ltd.; a silica sol in a dispersion medium of isopropanol having a silica concentration of 30% by mass and an average particle diameter of 10 to 15 nm), 135 parts by mass of methacryloxypropyl trimethoxysilane (trade name: Sila-Acc S710; manufactured by Chisso Petrochemical Corporation) and 40 parts by mass of 0.1 N hydrochloric acid were stirred at room temperature for 24 hours to prepare an isopropanol sol of silica having a photopolymerizable group (containing 585 parts by mass of silica to which a dispersant is added).

(Preparation of Inorganic Fine Particle to which Dispersant is not Added)

An organosilicasol (trade name: IPA-ST; manufactured by Nissan Chemical Industries, Ltd.; a silica sol in a dispersion medium of isopropanol having a silica concentration of 30% by mass and an average particle diameter of 10 to 15 nm) was prepared.

(Preparation of Photo-Curable Composition)

40 parts by mass of acryloyl morpholine (trade name: ACMO; manufactured by Kohjin Co., Ltd.), 35 parts by mass of polyethylene glycol dimethacrylate (trade name: 4EGMA; manufactured by Kyoeisha Chemical Co., Ltd.) and 25 parts by mass of pentaerythritol triacrylate (trade name: PETA; manufactured by Kyoeisha Chemical Co., Ltd.) were added and mixed to prepare a monomer composition.

90 parts by mass of the monomer composition was mixed with 30 parts by mass of an isopropanol sol of silica to which a dispersant is added (containing 10 parts by mass of silica to which a dispersant is added), and the isopropanol solvent in the resultant organosilicasol was distilled off under reduced pressure using an evaporator (manufactured by Tokyo Rikakikai Co., Ltd.) to produce a silica particles-containing monomer. The monomer was mixed with 1.25 parts by mass of Darocure 4265 (trade name; manufactured by Ciba Specialty Chemicals Corporation) in which 2,4,6-trimethylbenzoyl-diphenyl-phosphine oxide and 2-hydroxy-2-methyl-1-phenyl-propane-1-ketone are mixed in a ratio of 1:1 as a photopolymerization initiator to produce a photo-curable composition.

Example 2

A photo-curable composition was obtained in substantially the same manner as in Example 1, except that 80 parts by mass of the photo-curable monomer was mixed with 60 parts by mass of an isopropanol sol of silica to which a dispersant is added (containing 21 parts by mass of silica to which a dispersant is added), and the isopropanol solvent in the resultant organosilicasol was distilled off under reduced pressure using an evaporator (manufactured by Tokyo Rikakikai Co., Ltd.) to produce a silica particles-containing monomer.

Example 3

A photo-curable composition was obtained in substantially the same manner as in Example 1, except that 70 parts by mass of the photo-curable monomer was mixed with 90 parts by mass of an isopropanol sol of silica to which a dispersant is added (containing 31 parts by mass of silica to which a dispersant is added), and the isopropanol solvent in the resultant organosilicasol was distilled off under reduced pressure using an evaporator (manufactured by Tokyo Rikakikai Co., Ltd.) to produce a silica particles-containing monomer.

Comparative Example 1

40 parts by mass of acryloyl morpholine (trade name: ACMO; manufactured by Kohjin Co., Ltd.), 35 parts by mass of polyethylene glycol dimethacrylate (trade name: 4EGMA; manufactured by Kyoeisha Chemical Co., Ltd.) and 25 parts by mass of pentaerythritol triacrylate (trade name: PETA; manufactured by Kyoeisha Chemical Co., Ltd.) were added and mixed to prepare a photo-curable monomer. The monomer was mixed with 1.25 parts by mass of Darocure 4265 (trade name; manufactured by Ciba Specialty Chemicals Corporation) in which 2,4,6-trimethylbenzoyl-diphenyl-phosphine oxide and 2-hydroxy-2-methyl-1-phenyl-propane-1-ketone are mixed in a ratio of 1:1 as a photopolymerization initiator to produce a photo-curable composition.

Comparative Example 2

40 parts by mass of acryloyl morpholine (trade name: ACMO; manufactured by Kohjin Co., Ltd.), 35 parts by mass of polyethylene glycol dimethacrylate (trade name: 4EGMA; manufactured by Kyoeisha Chemical Co, Ltd.) and 25 parts by mass of pentaerythritol triacrylate (trade name: PETA; manufactured by Kyoeisha Chemical Co., Ltd.) were added and mixed to prepare a monomer composition.

90 parts by mass of the monomer composition was mixed with 30 parts by mass of an isopropanol sol of silica (trade name: IPA-ST; manufactured by Nissan Chemical Industries, Ltd.; containing 9 parts by mass of silica; and an average particle diameter: 10 to 15 nm), and the isopropanol solvent in the organosilicasol was distilled off under reduced pressure using an evaporator (manufactured by Tokyo Rikakikai Co., Ltd.) to produce a silica particles-containing monomer. The monomer was mixed with 1.25 parts by mass of Darocure 4265 (trade name; manufactured by Ciba Specialty Chemicals Corporation) in which 2,4,6-trimethylbenzoyl-diphenyl-phosphine oxide and 2-hydroxy-2-methyl-1-phenyl-propane-1-ketone are mixed in a ratio of 1:1 as a photopolymerization initiator to produce a photo-curable composition.

(Coating Film Property)

A silicon substrate was coated with the above-obtained photo-curable composition by a spin-coating method. The coating condition was at 500 rpm for 5 seconds and thereafter, at 2,000 rpm for 20 seconds. The changes in the coating film were observed immediately after the coating (FIG. 1), after leaving the coating for 20 minutes (FIG. 2), after leaving the coating for 60 minutes (FIG. 3) and after leaving the coating for 180 minutes (FIG. 4).

From the observation photographs of FIGS. 1 to 4, it was found that the films obtained from the photo-curable compositions of Examples 1 to 3 maintained a thin film state, however, the film obtained from the photo-curable composition of Comparative Example 1 could not maintain a thin film state such that a contrast appeared on the film.

Among the photo-curable compositions of Examples 1 to 3, the coating film formed from the photo-curable composition of Example 3 maintained the state immediately after the coating until 180 minutes after the coating, which is the most preferred in terms of the process management. That is, during such serial processes as coating the substrate with the photo-curable composition, pressure-bonding the mold and irradiating the composition With light, no coating unevenness was caused and the initial coating physical property was maintained, so that the composition has a wide temporal margin in the production process.

However, in the practical use thereof, there may be a case where within 20 minutes after coating with the photo-curable composition, the pressure-bonding of the mold and the light irradiation are performed and then, Examples 1 to 3 in which no coating unevenness is caused immediately after the coating have satisfactory coating characteristic in comparison with Comparative Examples 1 and 2.

In addition, in the coating film obtained from the photo-curable composition of Comparative Example 2, foreign matters having various sizes were observed in a step immediately after the coating. Moreover, there were observed such disadvantages that the whole coating film was heterogeneous, that film thicknesses were largely different from each other depending on the portion in the film and that the peeling of the film was observed. Thus, an advantageous film could not be obtained. Therefore, the coating film in Comparative Example 2 could not proceed to the forming test of the pattern (FIG. 7).

In other words, it was apparent that Examples 1 to 3 are excellent in coating property in comparison with Comparative Examples 1 and 2.

(Pattern Forming and Residual Film Evaluation)

The residual film means a film remaining after such serial processes as coating the substrate with the photo-curable composition, pressure-bonding the mold, curing the composition by a light irradiation, and removing the mold. When the mold is pressure bonded, ideally it is desired that the photo-curable composition between the bottom of the mold and the substrate is squeezed out and there exists no composition between the bottom of the mold and the substrate.

Actually, the composition remains between the bottom of the mold and the substrate and the remaining composition may exist as a residual film after the curing by a light irradiation. The residual film is removed afterward by a method such as etching and a desired pattern is formed on the substrate. However, a smaller amount of residual film makes it easier to remove the residual film by etching or the like. Therefore, the residual film is desired to be small in amount.

In the present invention, the formation of the pattern and the evaluation of the residual film were performed using an optical- and thermal-combination imprinting evaluation apparatus (trade name: LTNIP-5000; manufactured by Litho Tech Japan Corporation). Specifically, a silicon substrate was homogeneously coated with each of the photo-curable compositions obtained in Example 3 and Comparative Example 1 and the composition was embossed with a quartz glass mold having a concavo-convex shape on the surface thereof and was pressed while being irradiated with an ultraviolet light from a high pressure mercury lamp. The amount of the irradiated ultraviolet light was 3.2 J/cm$^2$ (converted into that at 365 nm) and the pressing was performed with 2000 N for 600 seconds.

Using a scanning electron microscope (S-2460N type; manufactured by HITACHI Corporation), a pattern obtained under conditions of an accelerating voltage of 15 kV and of a magnification of 30,000 was observed.

FIG. 5 shows the observation result of a three-dimensional pattern obtained from the photo-curable composition of Comparative Example 1, and FIG. 6 shows the observation result of a three-dimensional pattern obtained from the photo-curable composition of Example 3.

The pattern shape of Comparative Example 1 was the same as that of Example 3, however, in the evaluation of the residual film, the residual film of Example 3 was extremely thin in comparison with the residual film of Comparative Example 1, and was therefore advantageous.

In the result of Comparative Example 1 shown in FIG. 5, the initial film thickness at the coating with the photo-curable composition was 2,230 nm, and the thickness from the substrate to the portion in which a pattern was formed (residual-film thickness) after processes of embossing the composition with a mold, irradiating the composition with an ultraviolet ray and removing the mold after the curing, was 1,275 nm.

In the result of Example 3 shown in FIG. 6, the initial film thickness at the coating with the photo-curable composition was 3,720 nm, and the thickness from the substrate to the portion in which a pattern was formed (residual-film thickness) after processes of embossing the composition with a mold, irradiating the composition with an ultraviolet ray and removing the mold after the curing, was 544 nm.

From these results, it is apparent that the residual film of Example 3 was extremely thin in comparison with the residual film of Comparative Example 1, so that as the residual film result, Example 3 obtained an advantageous result in comparison with Comparative Example 1.

INDUSTRIAL APPLICABILITY

According to the present invention, in a process for forming a three-dimensional pattern by a photo-imprinting method, it is possible to provide a photo-curable composition that shows the suppression of the residual film formation and a high adhesion thereof to a substrate. Particularly, in applications such as semiconductor lithography, fine optical parts, photonic crystals, members for flat panel display and micro chemical chips, a precise pattern can be inexpensively and easily formed with a high precision.

Figure 1:
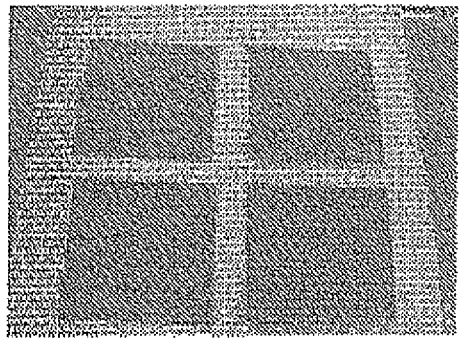
FIG. 1 is a photograph showing photo-curable compositions of Examples 1 to 3 and Comparative Example 1 in a state immediately after application thereof on a silicon substrate by a spin-coating method. Among the four photos shown in FIG. 1, the upper left photo is for Comparative Example 1; the upper right photo is for Example 1; the lower left photo is for Example 2; and the lower right photo is for Example 3.
Figure 2:
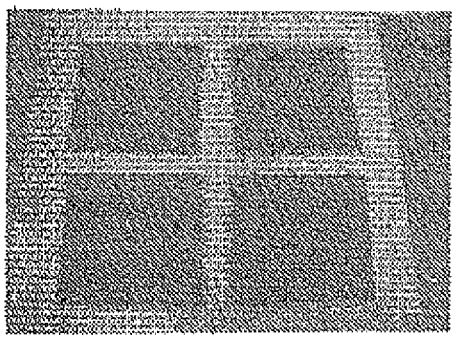
FIG. 2 is a photograph showing the photo-curable compositions of Examples 1 to 3 and Comparative Example 1 in a state 20 minutes after application thereof on a silicon substrate by a spin-coating method. Among the four photos shown in FIG. 2, the upper left photo is for Comparative Example 1; the upper right photo is for Example 1; the lower left photo is for Example 2; and the lower right photo is for Example 3.
Figure 3:
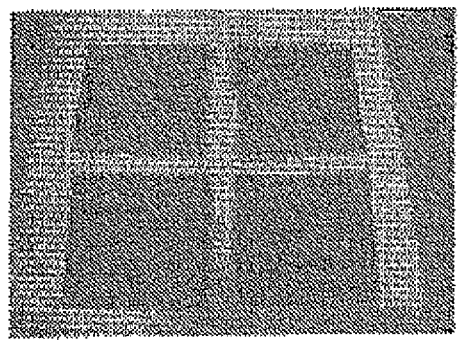
FIG. 3 is a photograph showing the photo-curable compositions of Examples 1 to 3 and Comparative Example 1 in a state 60 minutes after application thereof on a silicon substrate by a spin-coating method. Among the four photos shown in FIG. 3, the upper left photo is for Comparative Example 1; the upper right photo is for Example 1; the lower left photo is for Example 2; and the lower right photo is for Example 3.
Figure 4:
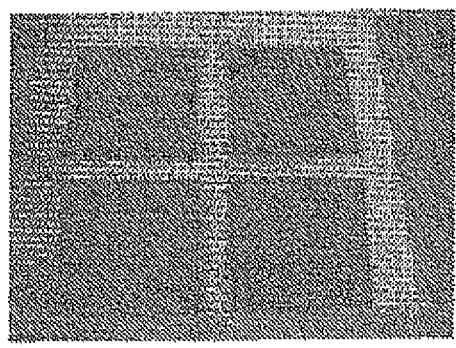
FIG. 4 is a photograph showing the photo-curable compositions of Examples 1 to 3 and Comparative Example 1 in a state 180 minutes after application thereof on a silicon substrate by a spin-coating method. Among the four photos shown in FIG. 4, the upper left photo is for Comparative Example 1; the upper right photo is for Example 1; the lower left photo is for Example 2; and the lower right photo is for Example 3.
Figure 5:
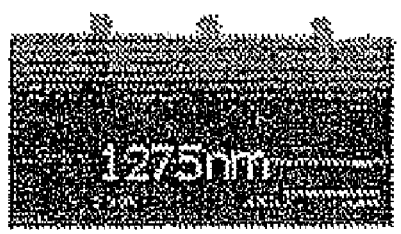
FIG. 5 is a result of the residual film evaluation when a three-dimensional pattern was formed by a photo-imprinting method, using the photo-curable composition of Comparative Example 1.
Figure 6:
FIG. 6 is a result of the residual film evaluation when a three-dimensional pattern was formed by a photo-imprinting method, using the photo-curable composition of Example 3.
Figure 7:
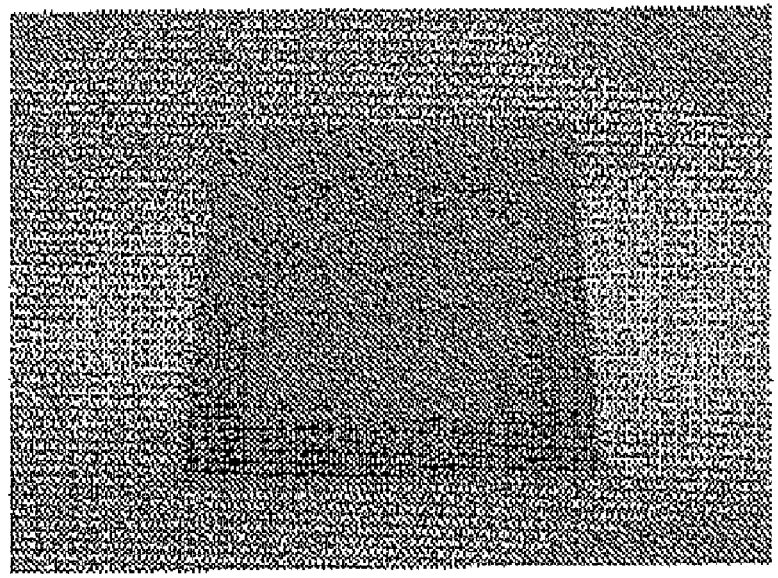
FIG. 7 is a photograph showing a coating state of a film obtained from the photo-curable composition of Comparative Example 2 immediately after coating.

The invention claimed is:

1. A photo-curable composition for forming a three-dimensional pattern by a photo-imprinting method, characterized by comprising:
    a monomer having a photopolymerizable group, the photopolymerizable group being at least one organic group selected from the group consisting of an acryl group, a methacryl group, a vinyl group, an epoxy group, an oxetane group, and a vinyl ether group,
    wherein the monomer contains a monofunctional monomer, a difunctional monomer, and a trifunctional monomer in a mass ratio of monofunctional monomer:difunctional monomer:trifunctional monomer equal to 1:0.2 to 2.0:0.2 to 2.0, and
    the monofunctional monomer is a cyclic amine-containing acrylate monomer;
    an inorganic fine particle, wherein a dispersant is added to the inorganic fine particle and wherein the dispersant is a silane coupling agent; and
    a photopolymerization initiator.

2. The photo-curable composition according to claim 1, wherein the inorganic fine particle has an average particle diameter of 1 to 1,000 nm.

3. The photo-curable composition according to claim 1, wherein the inorganic fine particle is silica.

4. The photo-curable composition according to claim 1, wherein the dispersant is a silane coupling agent containing an organic group having a carbon-carbon unsaturated bond or an organic group having an epoxy group.

5. The photo-curable composition according to claim 1, wherein the dispersant is a methacryloxypropyl trialkoxysilane or a glycidoxypropyl trialkoxysilane.

* * * * *